(12) United States Patent
Li et al.

(10) Patent No.: US 10,225,119 B2
(45) Date of Patent: Mar. 5, 2019

(54) DATA COMMUNICATION BASED ON FREQUENCY

(71) Applicant: INVENSENSE, INC., San Jose, CA (US)

(72) Inventors: Yuanjin Li, Shanghai (CN); Yang Pan, Shanghai (CN); Jia Zhao, Shanghai (CN); Dan Li, Shanghai (CN); Hao Ding, Shanghai (CN)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/786,104

(22) PCT Filed: Jul. 9, 2015

(86) PCT No.: PCT/CN2015/083644
§ 371 (c)(1),
(2) Date: Oct. 21, 2015

(87) PCT Pub. No.: WO2017/004827
PCT Pub. Date: Jan. 12, 2017

(65) Prior Publication Data
US 2018/0131543 A1    May 10, 2018

(51) Int. Cl.
| | |
|---|---|
| *H04L 27/12* | (2006.01) |
| *H04L 27/10* | (2006.01) |
| *H03L 7/087* | (2006.01) |
| *H04L 27/16* | (2006.01) |
| *H04L 27/28* | (2006.01) |

(52) U.S. Cl.
CPC .......... *H04L 27/122* (2013.01); *H03L 7/087* (2013.01); *H04L 27/10* (2013.01); *H04L 27/16* (2013.01); *H04L 27/28* (2013.01)

(58) Field of Classification Search
CPC ....... H04L 27/122; H04L 27/16; H04L 27/28; H03L 7/087
See application file for complete search history.

(56) References Cited

U.S. PATENT DOCUMENTS

| | | | |
|---|---|---|---|
| 2003/0039054 A1* | 2/2003 | Pasolini | G11B 5/5552 360/75 |
| 2007/0242130 A1 | 10/2007 | Kreiter | |
| 2010/0054486 A1 | 3/2010 | Sollenberger et al. | |

(Continued)

FOREIGN PATENT DOCUMENTS

| | | |
|---|---|---|
| CN | 104299616 A | 1/2015 |
| JP | 2006172564 A | 6/2006 |

OTHER PUBLICATIONS

International Search Report and Written Opinion dated Sep. 25, 2015 for PCT Application Serial No. PCT/CN2015/083644, 12 pages.

*Primary Examiner* — Kenneth T Lam
(74) *Attorney, Agent, or Firm* — Amin, Turocy & Watson, LLP

(57) ABSTRACT

Systems and techniques for communicating data as a function of frequency are presented. In an implementation, a system includes a microelectromechanical systems (MEMS) sensor, a digital signal processor and a frequency detection circuit. The digital signal processor is coupled to the MEMS sensor. The frequency detection circuit receives data encoded as a function of frequency from the digital signal processor via a clock communication channel.

22 Claims, 14 Drawing Sheets

(56) References Cited

U.S. PATENT DOCUMENTS

| | | | |
|---|---|---|---|
| 2013/0058495 A1* | 3/2013 | Furst | H03K 19/017509 |
| | | | 381/80 |
| 2013/0249410 A1* | 9/2013 | Thompson | H05B 37/0227 |
| | | | 315/158 |
| 2014/0003823 A1* | 1/2014 | Roberts | H04B 10/5563 |
| | | | 398/187 |
| 2014/0086433 A1* | 3/2014 | Josefsson | H04R 3/06 |
| | | | 381/98 |
| 2014/0142958 A1* | 5/2014 | Sharma | G10L 19/018 |
| | | | 704/500 |
| 2015/0125004 A1 | 5/2015 | Cagdaser et al. | |
| 2016/0161256 A1* | 6/2016 | Lee | B81B 7/008 |
| | | | 73/504.12 |
| 2017/0150261 A1* | 5/2017 | Conso | H04R 3/06 |

\* cited by examiner

| FREQUENCY VALUE | FIRST FREQUENCY (FREQ_START) | SECOND FREQUENCY (FREQ_STOP) | THIRD FREQUENCY (FREQ_0) | FOURTH FREQUENCY (FREQ_1) | FIFTH FREQUENCY (FREQ_READ) |
|---|---|---|---|---|---|
| COMMUNICATION INFORMATION | START OF A COMMUNICATION | STOP OF A COMMUNICATION | BOOLEAN VALUE '0' | BOOLEAN VALUE '1' | INITIATE READ BACK COMMUNICATION OPERATION |

DATA COMMUNICATION BASED ON FREQUENCY

CROSS-REFERENCE TO RELATED APPLICATION

This application is a U.S. National Stage application filing under 35 USC § 371 of International Application No. PCT/CN2015/083644, filed on Jul. 9, 2015, entitled "DATA COMMUNICATION BASED ON FREQUENCY," which is incorporated herein by reference in its entirety.

TECHNICAL FIELD

The subject disclosure relates to communicating data as a function of frequency.

BACKGROUND

Digital devices are widely integrated in consumer electronic devices. For example, a digital microphone can be integrated in a mobile device instead of an analog microphone. However, increased functionality of a digital device in a consumer electronic device often requires an increased number of controls signals and/or an increased number of communication interfaces. Moreover, as additional functions are added to a digital device in a consumer electronic device, design complexity of a processor in the consumer electronic device (e.g., a processor for executing the functions) is increased.

It is thus desired to provide a control interface that improves upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In accordance with an implementation, a system includes a microelectromechanical systems (MEMS) sensor, a digital signal processor and a frequency detection circuit. The digital signal processor is coupled to the MEMS sensor. The frequency detection circuit receives data encoded as a function of frequency from the digital signal processor via a clock communication channel.

In accordance with another implementation, a method provides for transmitting a data signal at a first frequency to represent a start of a communication with a device, transmitting data that is encoded as a function of frequency via the data signal, and transmitting the data signal at a second frequency to represent a stop of the communication with the device.

In accordance with yet another implementation, a device includes a processor that is coupled to a microelectromechanical systems (MEMS) sensor. The processor transmits a data signal at a first frequency to represent a beginning of a communication with another device, transmits data via the data signal that is encoded as a function of frequency, and transmits the data signal at a second frequency to represent an end of the communication with the other device.

In accordance with yet another implementation, a device includes a frequency detection circuit that receives a data signal at a first frequency that represents a beginning of a communication, receives the data signal at a second frequency or a third frequency that represents encoded data, and decodes the encoded data based on a set of defined frequencies.

These and other embodiments are described in more detail below.

BRIEF DESCRIPTION OF THE DRAWINGS

Various non-limiting embodiments are further described with reference to the accompanying drawings, in which:

FIG. 5 illustrates a set of defined frequencies, in accordance with various aspects and implementations described herein;

DETAILED DESCRIPTION

Overview

Figure 1:
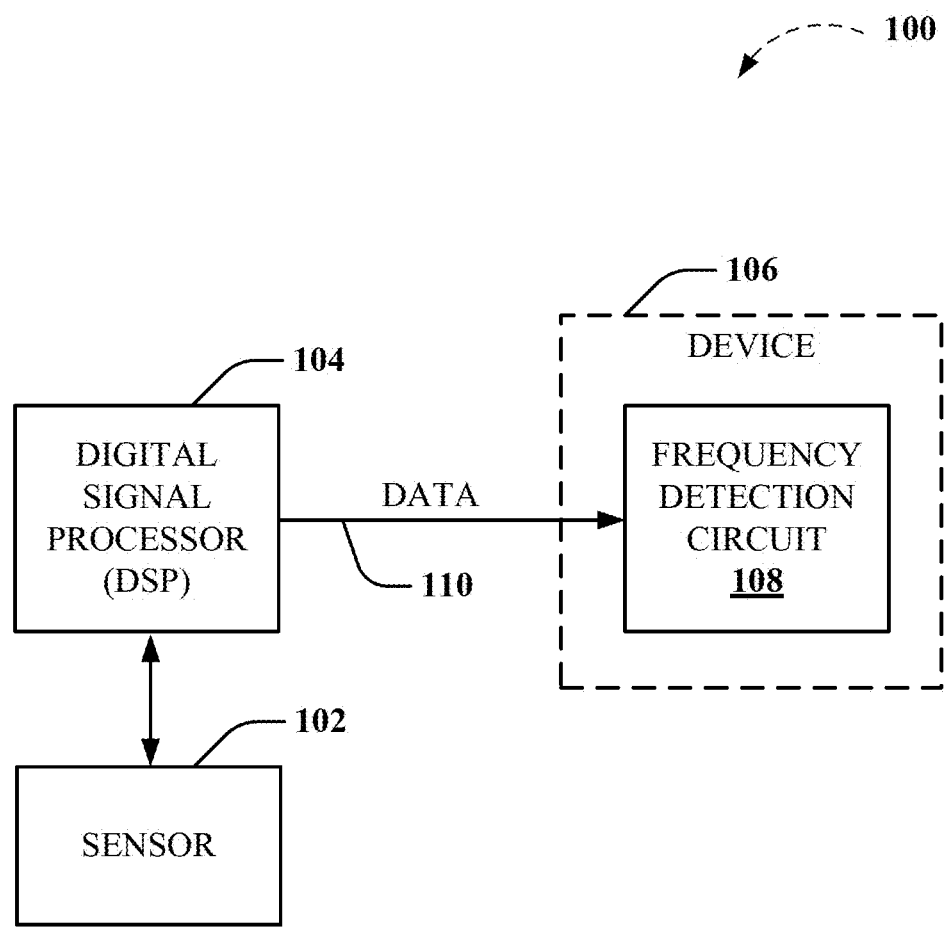
FIG. 1 depicts a functional block diagram of a system, in accordance with various aspects and implementations described herein.

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

As described above, digital devices are widely integrated in consumer electronic devices. For example, a digital microphone can be integrated in a mobile device instead of an analog microphone. However, increased functionality of a digital device in a consumer electronic device often requires an increased number of controls signals and/or an increased number of communication interfaces. Moreover, as additional functions are added to a digital device in a consumer electronic device, design complexity of a processor in the consumer electronic device (e.g., a processor for executing the functions) is increased.

To these and/or related ends, various aspects for communicating data as a function of frequency are described. The various embodiments of the apparatuses, techniques, and methods of the subject disclosure are described in the context of a digital signal processor employed in connection with a device. Exemplary embodiments of the subject disclosure employ a digital signal processor to, for example, communicate data to a device as a function of frequency. In an aspect, a clock communication channel can be employed to communicate data as a function of frequency. For example, different clock frequencies can represent different types of information. The different clock frequencies can be transmitted via the clock communication channel to facilitate encoding the different types of information. Therefore, the clock communication channel can be a single line control interface between the digital signal processor and the device. In another aspect, a frequency detection circuit can decode the data communicated as a function of frequency via the clock communication channel (e.g., a frequency detection circuit can decode the clock frequencies to obtain the different types of information). As such, functionality of a digital device can be increased without increasing number of controls signals and/or number of communication interfaces. Moreover, additional functions can be added to a digital device without increasing design complexity of a processor (e.g., a digital signal processor).

However, as further detailed below, various exemplary implementations can be applied to other areas of a preamplifier for a microphone, without departing from the subject matter described herein.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments.

FIG. 1 depicts a functional block diagram of a system 100 for communicating data as a function of frequency, according to various non-limiting aspects of the subject disclosure. The system 100 includes a sensor 102, a digital signal processor (DSP) 104 and a device 106. The device 106 includes a frequency detection circuit 108. In an implementation, the sensor 102 can be a microelectromechanical systems (MEMS) sensor. For example, the sensor 102 can be a MEMS microphone (e.g., a MEMS microphone component, a MEMS microphone element, a MEMS microphone sensor, etc.), such as but not limited to, a capacitive MEMS microphone, a piezoelectric MEMS microphone, a pizeoresistive MEMS microphone, a condenser MEMS microphone, an electret MEMS microphone, an analog MEMS microphone, a digital MEMS microphone, another type of MEMS microphone, etc. In aspect, the sensor 102 can be included in a housing (e.g., a microphone module). The DSP 104 can be mechanically, electrically, and/or communicatively coupled to the sensor 102. In certain implementations, the DSP 104 can be associated with a codec. In one example, the DSP 104 can be implemented separate from the sensor 102. In another example, the sensor 102 can include the DSP 104. In yet another example, the sensor 102 and/or the DSP 104 can be implemented as a first device, and the device 106 can be implemented as a second device. In yet another example, the DSP 104 can be associated with an application specific integrated circuit (ASIC) complementary metal oxide semiconductor (CMOS) chip that supports the sensor 102. Furthermore, the DSP 104 can be mechanically, electrically, and/or communicatively coupled to the device 106. In one example, the device 106 can be a digital microphone.

The frequency detection circuit 108 can receive data (e.g., DATA shown in FIG. 1) from the DSP 104 via a clock communication channel 110. In an aspect, at least a portion of the data 110 can be associated with data (e.g., a signal, a voltage, etc.) generated by the sensor 102. The clock communication channel 110 can be employed as a single line control interface between the DSP 104 and the device 106 (e.g., the frequency detection circuit 108). For example, the clock communication channel 110 can be an only channel that is employed by the DSP 104 to control the device 106. The data transmitted to the frequency detection circuit 108 can be encoded as a function of frequency. For example, a set of frequencies can be defined to represent information associated with the DSP 104 (e.g., different frequencies can be defined to represent different information associated with the DSP 104). Therefore, the DSP 104 can encode the data based on a set of defined frequencies. In an aspect, the DSP 104 can transmit the data at a first frequency to represent a start of a communication with the frequency detection circuit 108. Furthermore, the DSP 104 can transmit the data at a second frequency to represent an end of the communication with the frequency detection circuit 108. In another aspect, the DSP 104 can transmit the data at a third frequency to represent a first Boolean value (e.g., a logical '0' value). Furthermore, the DSP 104 can transmit the data at a fourth frequency to represent a second Boolean value (e.g., a logical '1' value). Therefore, the DSP 104 can transmit a data signal at a particular frequency to represent a beginning of a communication with the device 106, transmit data (e.g., digital data associated with the sensor 102) via the data signal that is encoded as a function of frequency, and transmitting the data signal at another particular frequency to represent an end of the communication with the device 106.

The frequency detection circuit 108 can decode the data received via the clock communication channel 110. For example, the frequency detection circuit 108 can decode the data received via the clock communication channel 110 based on a set of defined frequencies. In an implementation, the frequency detection circuit 108 can receive the data at a first frequency that represents a beginning of a communication with the DSP 104. After receiving the data at the first frequency, the frequency detection circuit 108 can receive the data signal at a second frequency or a third frequency that represents encoded data (e.g., encoded digital data associated with the sensor 102). The frequency detection circuit 108 can decode the encoded data based on a set of defined frequencies. For example, the frequency detection circuit 108 can decode the data as the first Boolean value in response to detection of the data at a particular frequency and/or can decode the data as the second Boolean value in response to detection of the data at another particular frequency. Additionally, the frequency detection circuit 108 can receive the data at a fourth frequency that represents an end of the communication with the DSP 104. It is to be appreciated that, in certain implementations, the clock communication channel 110 can also be employed to communicate a clock signal (e.g., a signal at a different frequency) to control timing associated with the device 106.

Figure 2:
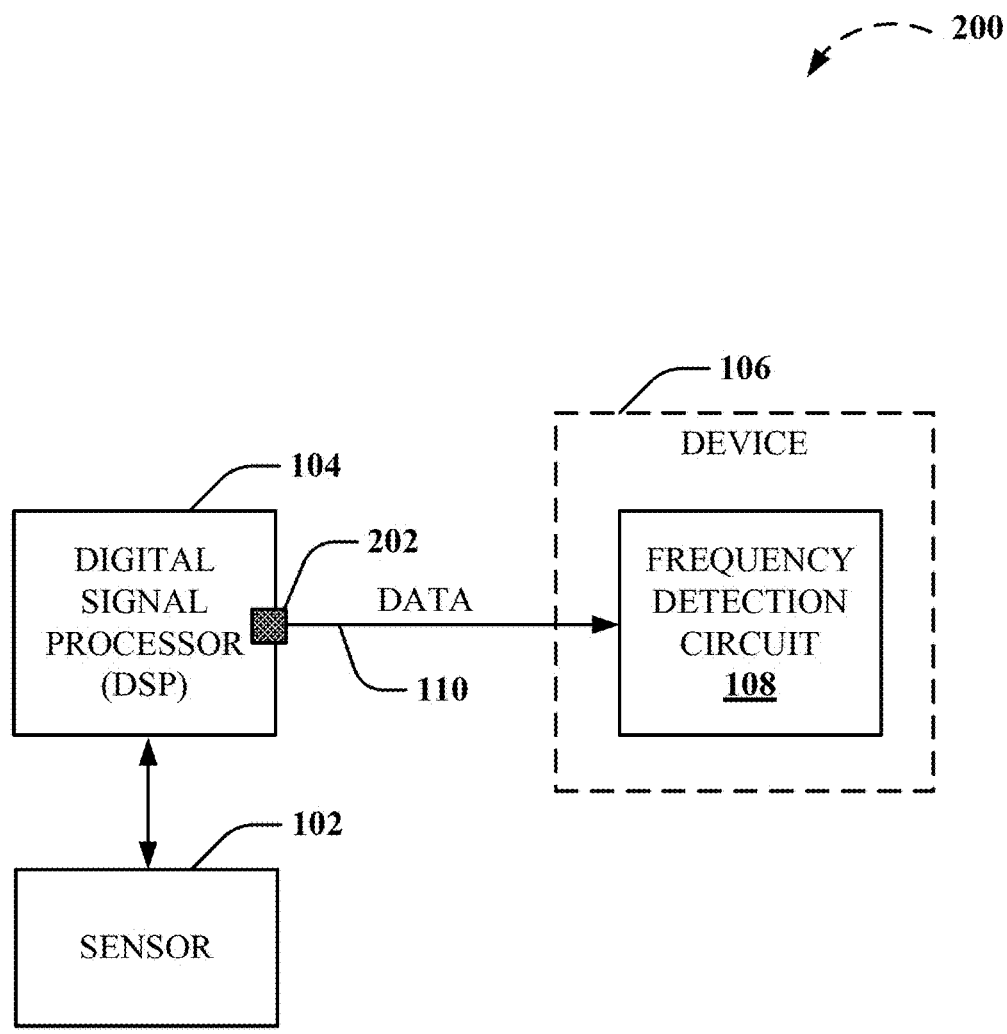
FIG. 2 depicts a functional block diagram of another system, in accordance with various aspects and implementations described herein.

FIG. 2 depicts a functional block diagram of a system 200 for communicating data via a single line control interface, according to various non-limiting aspects of the subject disclosure. The system 200 includes the sensor 102, the DSP 104 and the device 106. The device 106 includes the frequency detection circuit 108. In an implementation, the DSP 104 includes a clock pin 202. The clock pin 202 can be a clock terminal and/or can be associated with a conductive contact (e.g., a metal contact). Furthermore, the clock pin 202 can be electrically coupled to the clock communication channel 110. The clock pin 202 can be utilized for transmission of the data to the frequency detection circuit 108. For example, the clock pin 202 can be utilized to communicate data, encoded as a function of frequency, to the device 106. In an aspect, the clock pin 202 can be employed by the DSP 104 as a single line control interface with the device 106. For example, the DSP 104 can employ the clock pin 202 to control the device 106. Therefore, an extra pin is not required to control the device 106. Furthermore, a design of the DSP 104 is not required to change to control the device 106.

Figure 3:
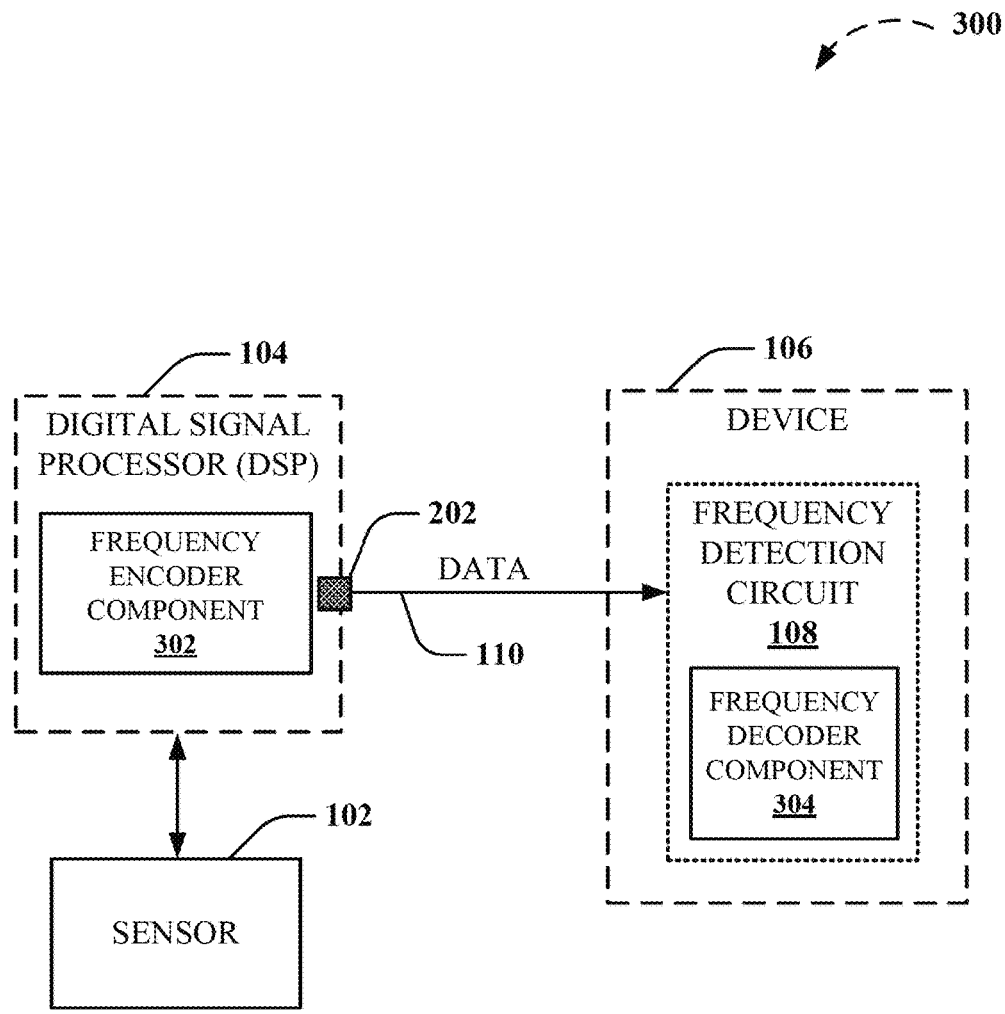
FIG. 3 depicts a functional block diagram of a digital signal processor and a frequency detection circuit, in accordance with various aspects and implementations described herein.

FIG. 3 depicts a functional block diagram of a system 300 for communicating data as a function of frequency, according to various non-limiting aspects of the subject disclosure. The system 300 includes the sensor 102, the DSP 104 and the device 106. The device 106 includes the frequency detection circuit 108. The DSP 104 includes a frequency encoder component 302. Furthermore, the frequency detection circuit 108 includes a frequency decoder component 304. In an aspect, the DSP 104 includes the clock pin 202.

The frequency encoder component 302 can encode information associated with a communication indictor (e.g., a communication flag) based on frequency. For example, the frequency encoder component 302 can encode an indicator that represents a start of a communication (e.g., a beginning of a communication with the device 106) as a first frequency and/or can encode an indicator that represents a stop of a communication (e.g., an end of a communication with the device 106) as a second frequency. Additionally or alternatively, the frequency encoder component 302 can encode information associated with the sensor 102 based on frequency. For example, the frequency encoder component 302 can encode a set of digital information (e.g., a set of bit values) associated with the sensor 102 based on frequency. In one example, the frequency encoder component 302 can encode a first bit value (e.g., a Boolean value equal to '0') as a third frequency and/or can encode a second bit value (e.g., a Boolean value equal to '1') as a fourth frequency. Additionally or alternatively, the frequency encoder component 302 can encode a command for the device 106 based on frequency. For example, the frequency encoder component 302 can encode a command to initiate an operation associated with the device 106 (e.g., a communication operation, a read back communication operation, etc.) as a fifth frequency. It is to be appreciated that the frequency encoder component 302 can additionally or alternatively encode other types of information associated with the sensor 102, the DSP 104, the device 106 and/or another component based on frequency.

The frequency decoder component 304 can decode a frequency, received via the clock communication channel 110, to obtain the data transmitted by the DSP 104. For example, the frequency decoder component 304 can decode the first frequency to determine the start of the communication with the DSP 104 (e.g., the beginning of the communication with the DSP 104) and/or can decode the second frequency to determine the stop of the communication with the DSP 104 (e.g., the end of the communication with the DSP 104). Furthermore, the frequency decoder component 304 can decode the third frequency to obtain the first bit value (e.g., the Boolean value equal to '0') and/or can decode the fourth frequency to obtain the second bit value (e.g., the Boolean value equal to '1'). The frequency decoder component 304 can also decode the fifth frequency to obtain the command to initiate the operation associated with the device 106. As such, the frequency decoder component 304 can obtain the information associated with the sensor 102 (e.g., the frequency decoder component 304 can obtain the set of digital information associated with the sensor 102) by decoding a set of frequencies received via the clock communication channel 110. It is to be appreciated that the frequency decoder component 304 can additionally or alternatively decode other frequencies to obtain information associated with the sensor 102, the DSP 104, the device 106 and/or another component based on frequency. In an aspect, a data store associated with the DSP 104 and/or the frequency detection circuit 108 (e.g., the frequency encoder component 302 and/or the frequency decoder component 304) can store a set of defined frequencies and corresponding communication information to facilitate encoding and/or decoding of data based on frequency.

Figure 4:
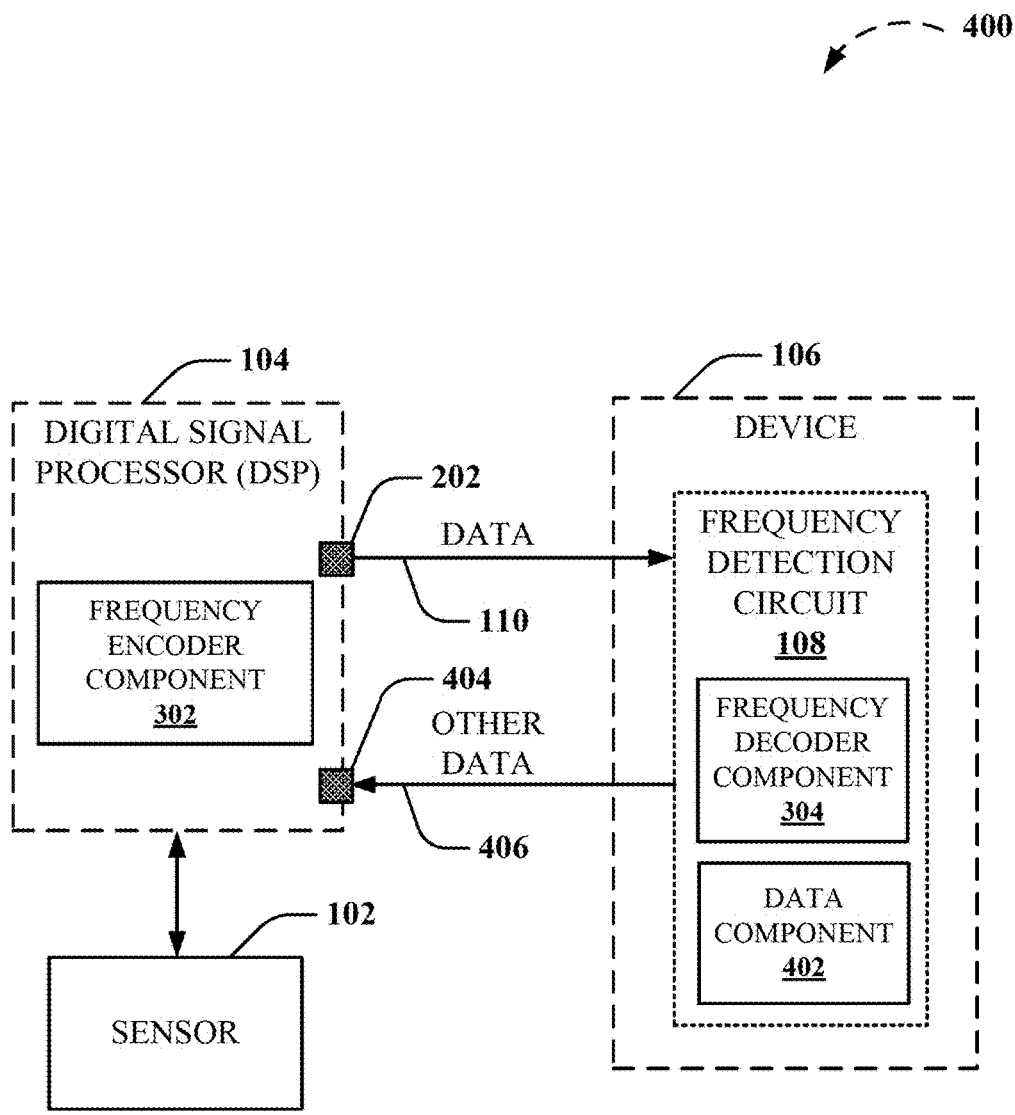
FIG. 4 depicts a functional block diagram of yet another system, in accordance with various aspects and implementations described herein.

FIG. 4 depicts a functional block diagram of a system 400 for controlling a device via a single line control interface, according to various non-limiting aspects of the subject disclosure. The system 400 includes the sensor 102, the DSP 104 and the device 106. The device 106 includes the frequency detection circuit 108. The DSP 104 includes the frequency encoder component 302. Furthermore, the frequency detection circuit 108 includes the frequency decoder component 304 and a data component 402. In an implementation, the DSP 104 includes the clock pin 202 and a data pin 404. The data pin 404 can be a data terminal and/or can be associated with a conductive contact (e.g., a metal contact). Furthermore, the data pin 404 can be electrically coupled to a data communication channel 406.

In an aspect, the DSP 104 can transmit the data at a fifth frequency (e.g., via the clock communication channel 110) to initiate an operation associated with the frequency detection circuit 108. For example, the DSP 104 can transmit the data at a fifth frequency (e.g., via the clock communication channel 110) to initiate a read back communication operation associated with the frequency detection circuit 108. In another aspect, the frequency detection circuit 108 can transmit other data associated with the operation to the DSP 104 via the data communication channel 406. For example, the frequency detection circuit 108 can transmit other data associated with the read back communication operation to the DSP 104 via the data communication channel 406. The data pin 404 can be utilized, for example, to receive the other data from the frequency detection circuit 108. Therefore, the clock pin 202 can be employed as a single line interface to control the device 106, and the data pin 404 can be employed to receive information from the device 106.

FIG. 5 depicts exemplary frequency values (e.g., a set of defined frequencies) and corresponding communication information, according to various non-limiting aspects of the subject disclosure. As shown in FIG. 5, a first frequency (e.g., FREQ_START), a second frequency (e.g., FREQ_STOP), a third frequency (e.g., FREQ_0), a fourth frequency (e.g., FREQ_1) and/or a fifth frequency (FREQ_READ) can be defined to represent various communication information. Communication information for the first frequency can be associated with a start of a communication, communication information for the second frequency can be associated with a stop of a communication, communication information for the third frequency can be associated with a Boolean value equal to '0', communication information for the fourth frequency can be associated with a Boolean value equal to '1', and communication information for the fifth frequency can be associated with initiation of a read back communication operation. For example, a value associated with the first frequency can represent a start of a communication, a value associated with the second frequency can represent a stop of a communication, a value associated with the third frequency can represent a Boolean value equal to '0', a value associated with the fourth frequency can represent a Boolean value equal to '1', and a value associated with the fifth frequency can initiate a read back communication operation. However, it is to be appreciated that a different number of frequency values and/or different types of communication information can be defined. In an aspect, the third frequency and the fourth frequency (e.g., the third frequency that represent the Boolean value equal to '0' and the fourth frequency that represent the Boolean value equal to '1') can be associated with data (e.g., a signal, a voltage, etc.) generated by the sensor 102.

Figure 6:
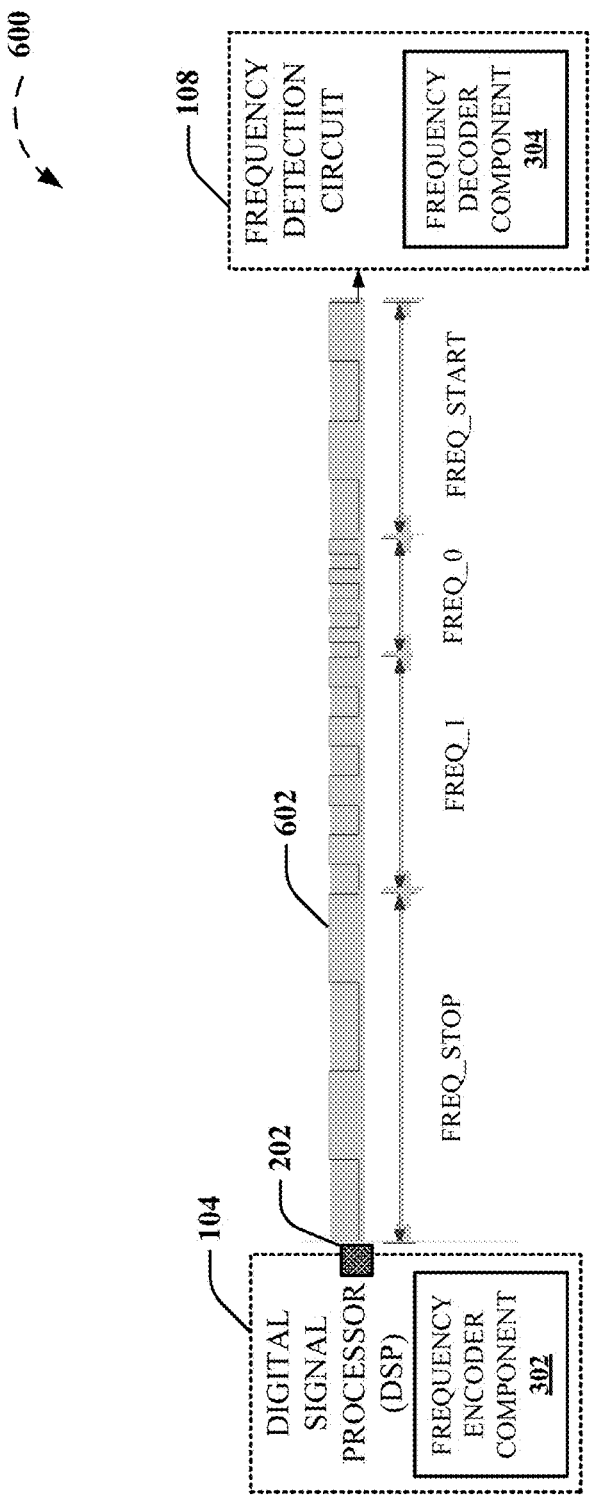
FIG. 6 depicts exemplary data communicated between a digital signal processor and a frequency detection circuit, in accordance with various aspects and implementations described herein.

Referring now to FIG. 6, illustrated is exemplary data 602 communicated between the DSP 104 and the frequency detection circuit 108, according to various non-limiting aspects of the subject disclosure. The data 602 can be, for example, a data signal encoded as a function of frequency. The frequency detection circuit 108 can be associated with the device 106. The frequency detection circuit 108 can receive the data 602 from the DSP 104 via the clock communication channel 110. For example, the DSP 104 can transmit the data 602 to the frequency detection circuit 108 via the clock pin 202 of the DSP 104.

The frequency encoder component 302 of the DSP 104 can encode the data 602 based on a set of frequency values. For example, at a beginning of a communication with the frequency detection circuit 108, the DSP 104 can transmit the data 602 at a first frequency (e.g., FREQ_START) to represent a start of the communication with the frequency detection circuit 108 (e.g., the frequency encoder component 302 can encode the data 602 at a first frequency value). Then, the DSP 104 can transmit a set of bit values (e.g., a set of digital values) to the frequency detection circuit 108 as a function of frequency. For example, the DSP 104 can transmit the data 602 at a second frequency (e.g., FREQ_0) to represent a Boolean value equal to '0' (e.g., the frequency encoder component 302 can encode the data 602 at a second frequency value), the DSP 104 can transmit the data 602 at a third frequency (e.g., FREQ_1) to represent a Boolean value equal to '1' (e.g., the frequency encoder component 302 can encode the data 602 at a third frequency value), etc. After transmitting the set of bit values (e.g., the set of digital values), at an end of the communication with the frequency detection circuit 108, the DSP 104 can transmit the data 602 at a fourth frequency (e.g., FREQ_STOP) to represent a stop of the communication with the frequency detection circuit 108 (e.g., the frequency encoder component 302 can encode the data 602 at a fourth frequency value).

The frequency decoder component 304 can decode the data 602 based on the set of frequency values. For example, at the beginning of the communication with the DSP 104, the frequency detection circuit 108 can receive the data 602 at the first frequency (e.g., FREQ_START) and can decode the data 602 to determine the start of the communication with the DSP 104. Then, the frequency detection circuit 108 can decode the set of bit values (e.g., the set of digital values) that are encoded as a function of frequency. For example, the frequency detection circuit 108 can determine that the data 602 at the second frequency (e.g., FREQ_0) represents the Boolean value equal to '0' (e.g., the frequency decoder component 304 can decode the second frequency value), the frequency detection circuit 108 can determine the data 602 at the third frequency (e.g., FREQ_1) represents the Boolean value equal to '1' (e.g., the frequency decoder component 304 can decode the third frequency value), etc. Furthermore, at the end of the communication with the DSP 104, the frequency detection circuit 108 can receive the data 602 at the fourth frequency (e.g., FREQ_STOP) and can decode the data 602 to determine the stop of the communication with the DSP 104.

Figure 7:
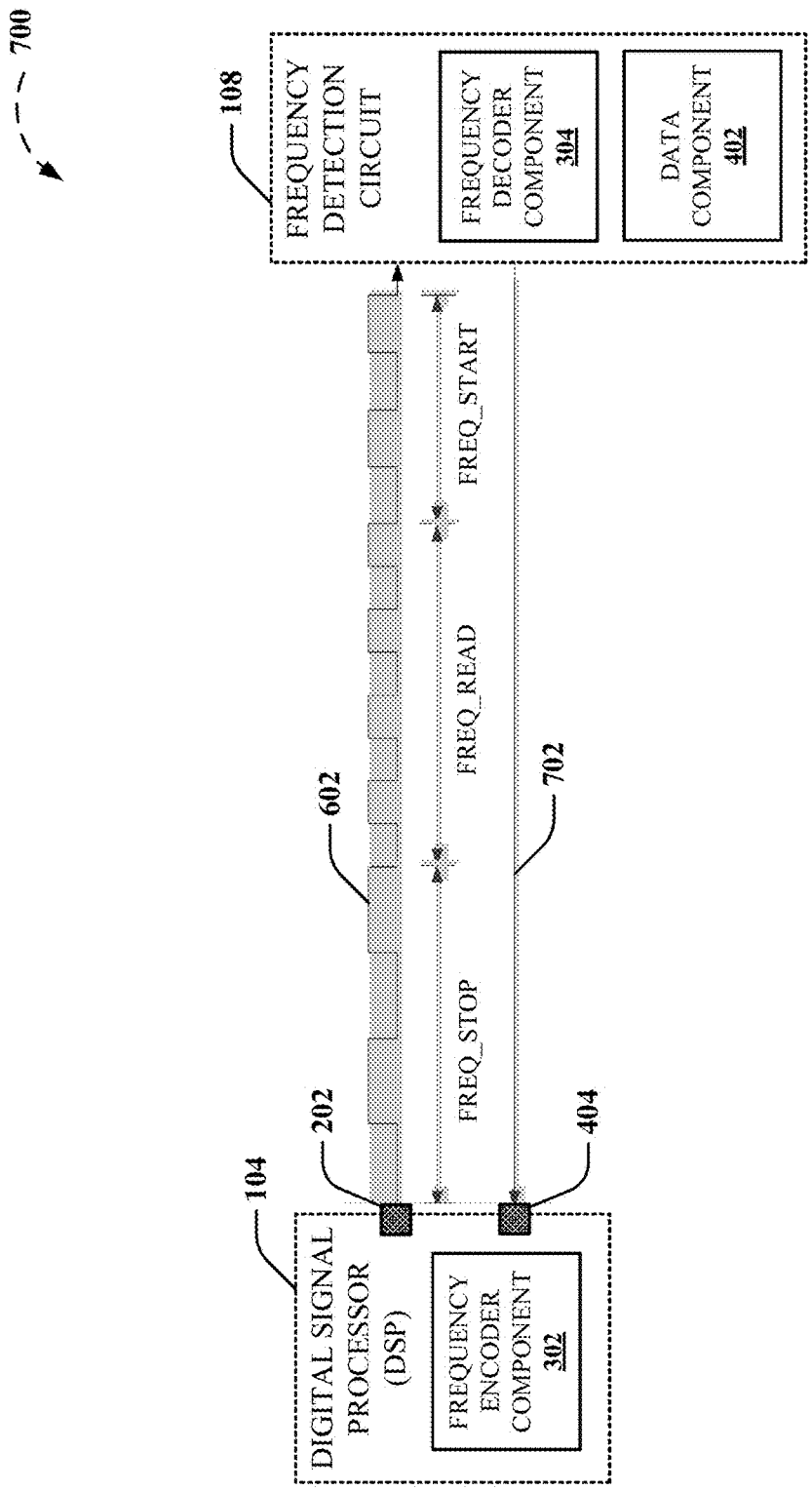
FIG. 7 depicts other exemplary data communicated between a digital signal processor and a frequency detection circuit, in accordance with various aspects and implementations described herein.

Referring to FIG. 7, further illustrated is exemplary data 702 communicated between the DSP 104 and the frequency detection circuit 108, according to various non-limiting aspects of the subject disclosure. The data 702 can be, for example, a data signal associated with data that is different than the data 602. In one example, the data 702 can be associated with a read back communication operation. The DSP 104 can receive the data 702 from the frequency detection circuit 108 via the data communication channel 406. For example, the frequency detection circuit 108 can transmit the data 702 to the DSP 104 and/or the DSP 104 can receive the data 702 via the data pin 404 of the DSP 104.

In an aspect, at a beginning of a communication with the frequency detection circuit 108, the DSP 104 can transmit the data 602 at a first frequency (e.g., FREQ_START) to represent a start of the communication with the frequency detection circuit 108 (e.g., the frequency encoder component 302 can encode the data 602 at a first frequency value). Then, the DSP 104 can transmit the data 602 at a fifth frequency (e.g., FREQ_READ) to initiate a read back communication operation associated with the frequency detection circuit 108 (e.g., the frequency encoder component 302 can encode the data 602 at a fifth frequency value). In response to receiving the data 602 at the fifth frequency, the frequency detection circuit 108 can begin a read back communication operation. For example, the data component 402 can perform the read back communication operation. Furthermore, the frequency encoder component 302 can transmit the data 702 associated with the read back communication operation to the DSP 104. At the end of the communication with the DSP 104, the frequency detection circuit 108 can then receive the data 602 at the fourth frequency (e.g., FREQ_STOP) and can decode the data 602 to determine the stop of the communication with the DSP 104.

Figure 8:
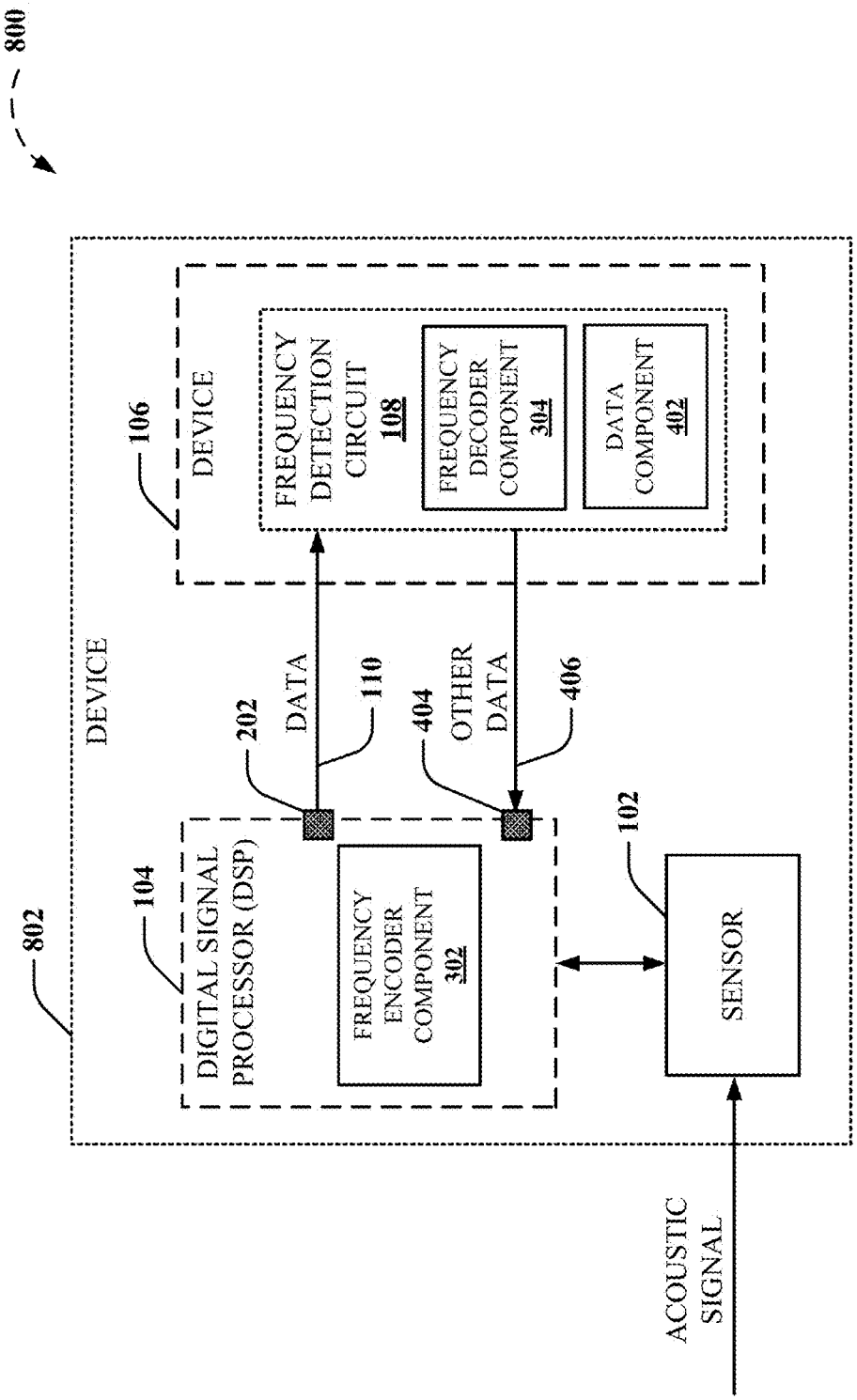
FIG. 8 depicts a functional block diagram of yet another system, in accordance with various aspects and implementations described herein.

FIG. 8 depicts a functional block diagram of a system 800, according to various non-limiting aspects of the subject disclosure. The system 800 includes a device 802. The device 802 can be, for example, a consumer electronic device. For example, the device 802 can be a phone, a smartphone, a smartwatch, a tablet, an eReader, a netbook, an automotive navigation device, a gaming console or device, a wearable computing device, another type of computing device, etc. The device 802 includes the sensor 102, the DSP 104 and the device 106. In an aspect, the device 106 includes the frequency detection circuit 108 and the DSP 104 includes the frequency encoder component 302. Additionally, the frequency detection circuit 108 includes the frequency decoder component 304 and/or the data component 402. In an implementation, the DSP 104 includes the clock pin 202 and/or the data pin 404. In an aspect, the device 802 can include an opening (e.g., an audio port, an audio path, an audio channel, an audio passage, etc.) for sound to travel to reach the sensor 102. For example, the device 802 can receive an acoustic signal (e.g., ACOUSTIC SIGNAL shown in FIG. 8) via an opening (e.g., an audio port, an audio path, an audio channel, an audio passage, etc.) associated with the sensor 102. In an aspect, at least a portion of the data transmitted to the frequency detection circuit 108 via the clock communication channel 110 (e.g., Boolean values, a set of bit values, a set of digital values, etc.) can be associated with data generated by the sensor 102 in response to the acoustic signal.

Figure 9:
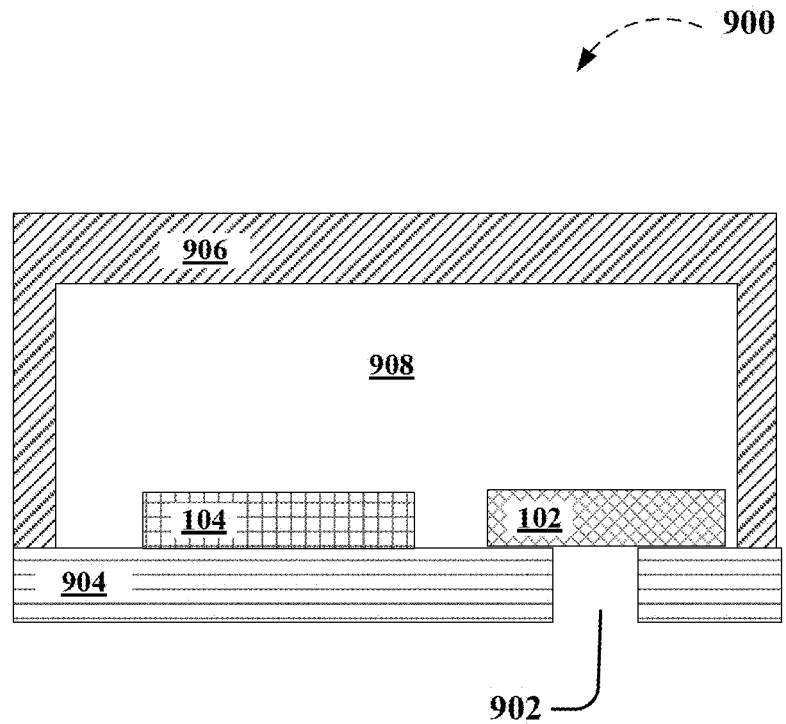
FIG. 9 depicts a non-limiting example of a microphone housing, in accordance with various aspects and implementations described herein.

FIG. 9 depicts a non-limiting embodiment of a microphone housing (e.g., a microphone module) 900. The microphone housing 900 can include at least the sensor 102. In one example, the sensor 102 can be a microphone sensor (e.g., an acoustic sensor). Therefore, in one example, the microphone housing 900 can be a sensor package (e.g., a microphone sensor package). Additionally, in certain implementations, the microphone housing 900 can include the DSP 104. However, it is to be appreciated that, in certain implementations, the DSP 104 can be implemented outside the microphone housing 900. In an aspect, the microphone housing 900 can comprise an enclosure comprising a substrate (e.g., a sensor or microphone package substrate) 904 and a lid 906 that can house and define a cavity 908 for the sensor 102 and/or the DSP 104. The enclosure comprising the substrate 904 and the lid 906 can comprise an opening 902. The opening 902 can be an opening that is adapted to receive acoustic waves or acoustic pressure. The opening 902 can alternatively be located in the lid 906 for other configurations of the microphone housing 900. The sensor 102 and the DSP 104 can be mechanically affixed to the substrate 904 and/or can be communicably coupled thereto. In an implementation, the DSP 104 can be communicably coupled to the sensor 102 via the substrate 904 and/or via bonding wire(s). Additionally or alternatively, the DSP 104 can be directly coupled to the sensor 102.

Figure 10:
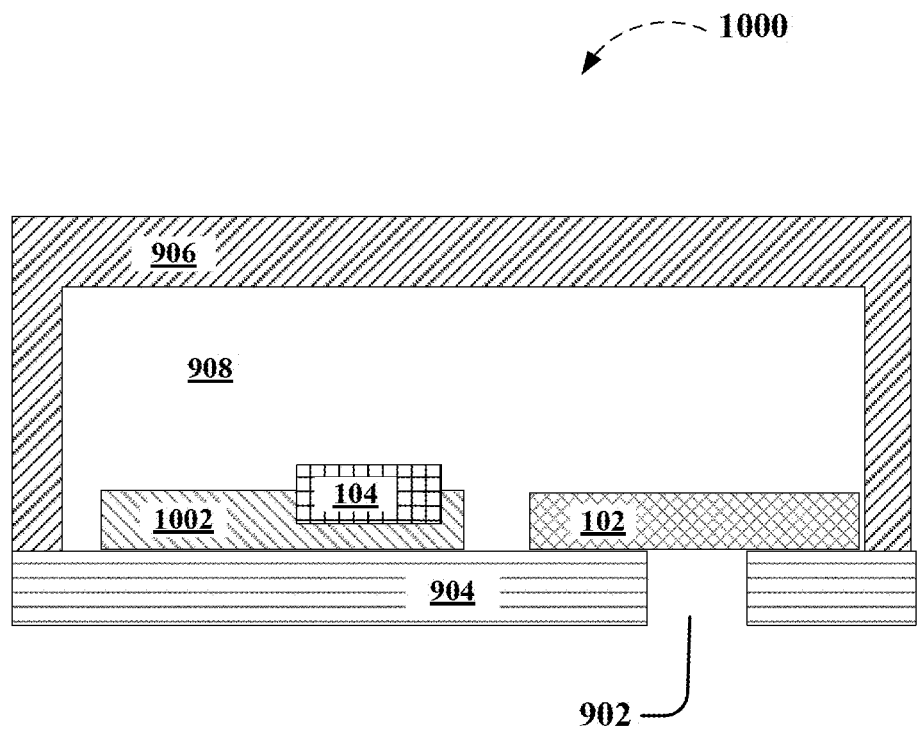
FIG. 10 depicts another non-limiting example of a microphone housing, in accordance with various aspects and implementations described herein.

FIG. 10 depicts a non-limiting embodiment of a microphone housing 1000. The microphone housing 1000 can comprise the opening 902, the substrate 904, the lid 906, the cavity 908, the sensor 102 and the DSP 104. In the embodiment depicted in FIG. 10, the microphone housing 1000 can also comprise an ASIC 1002. The DSP 104 can be integrated with the ASIC 1002. For example, at least a portion of the ASIC 1002 can be associated with the DSP 104. The ASIC 1002 can be mechanically affixed to the substrate 904. Additionally, the ASIC 1002 and can be communicably coupled to the sensor 102 via the substrate 904 and/or can be directly coupled to the sensor 102. In an implementation, the sensor 102 can be communicably coupled and mechanically affixed to the ASIC 1002 in addition to the DSP 104 or instead of the DSP 104. However, it is to be appreciated that the sensor 102, the DSP 104 and/or the ASIC 1002 can be implemented in the microphone housing 1000 in a different manner.

While various embodiments for communicating data associated with a digital signal processor and/or a sensor according to aspects of the subject disclosure have been described herein for purposes of illustration, and not limitation, it can be appreciated that the subject disclosure is not so limited. Various implementations can be applied to other areas for communicating data, without departing from the subject matter described herein. For instance, it can be appreciated that other applications requiring communication of data can employ aspects of the subject disclosure. Furthermore, various exemplary implementations of systems as described herein can additionally, or alternatively, include other features, functionalities and/or components and so on.

In view of the subject matter described supra, methods that can be implemented in accordance with the subject disclosure will be better appreciated with reference to the flowcharts of FIGS. 11-14. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

Figure 11:
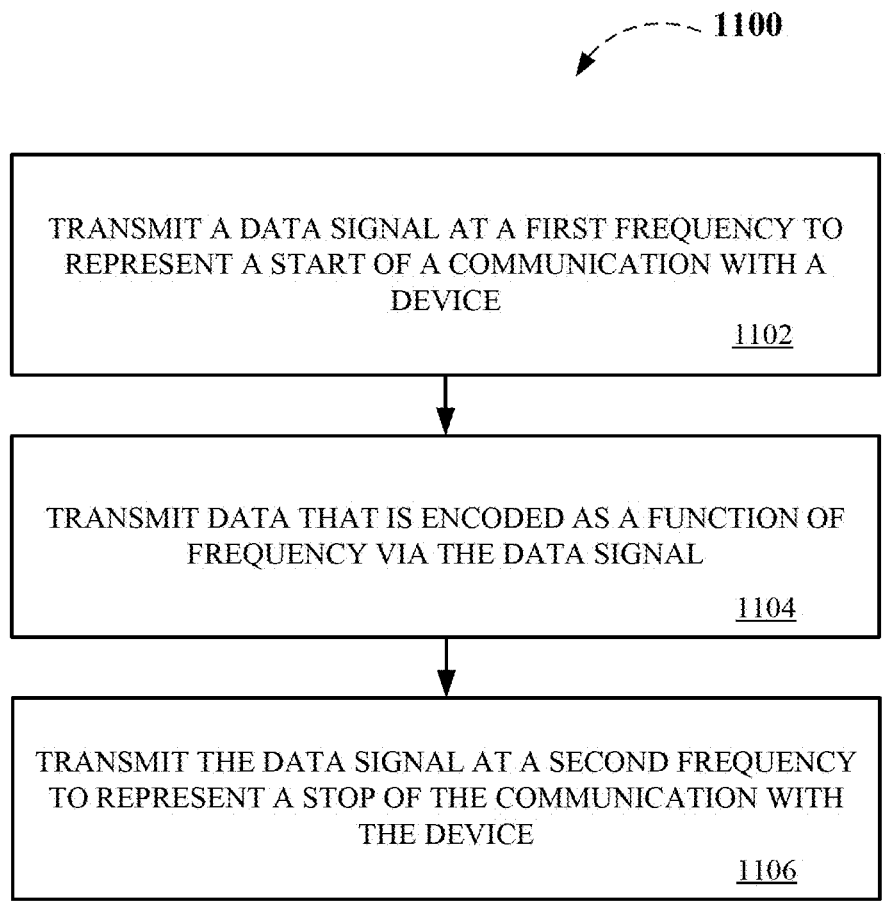
FIG. 11 is a flowchart of an example methodology for communicating data as a function of frequency, in accordance with various aspects and implementations described herein.

FIG. 11 depicts an exemplary flowchart of a non-limiting method 1100 for communicating data as a function of frequency, according to various non-limiting aspects of the subject disclosure. In an aspect, the method 1100 can be associated with a digital signal processor (e.g., the DSP 104). Initially, at 1102, a data signal is transmitted at a first frequency to represent a start of a communication with a device. In one example, the device can be a digital microphone. In an aspect, the data signal can be transmitted at the first frequency via a clock communication channel. At 1104, data that is encoded as a function of frequency is transmitted via the data signal. For example, the data signal can be transmitted at a particular frequency to represent a first data value (e.g., a first bit value, a first digital value, a first Boolean value, etc.). Additionally or alternatively, the data signal can be transmitted at another particular frequency to represent a second data value (e.g., a second bit value, a second digital value, a second Boolean value, etc.). In an aspect, the data can be a set of bit values (e.g., a set of digital values) associated with a sensor. In another aspect, the data signal can be transmitted at the particular frequency and/or the other particular frequency via the clock communication channel. At 1106, the data signal is transmitted at a second frequency to represent a stop of the communication with the device. In an aspect, the data signal can be transmitted at the second frequency via the clock communication channel.

Figure 12:
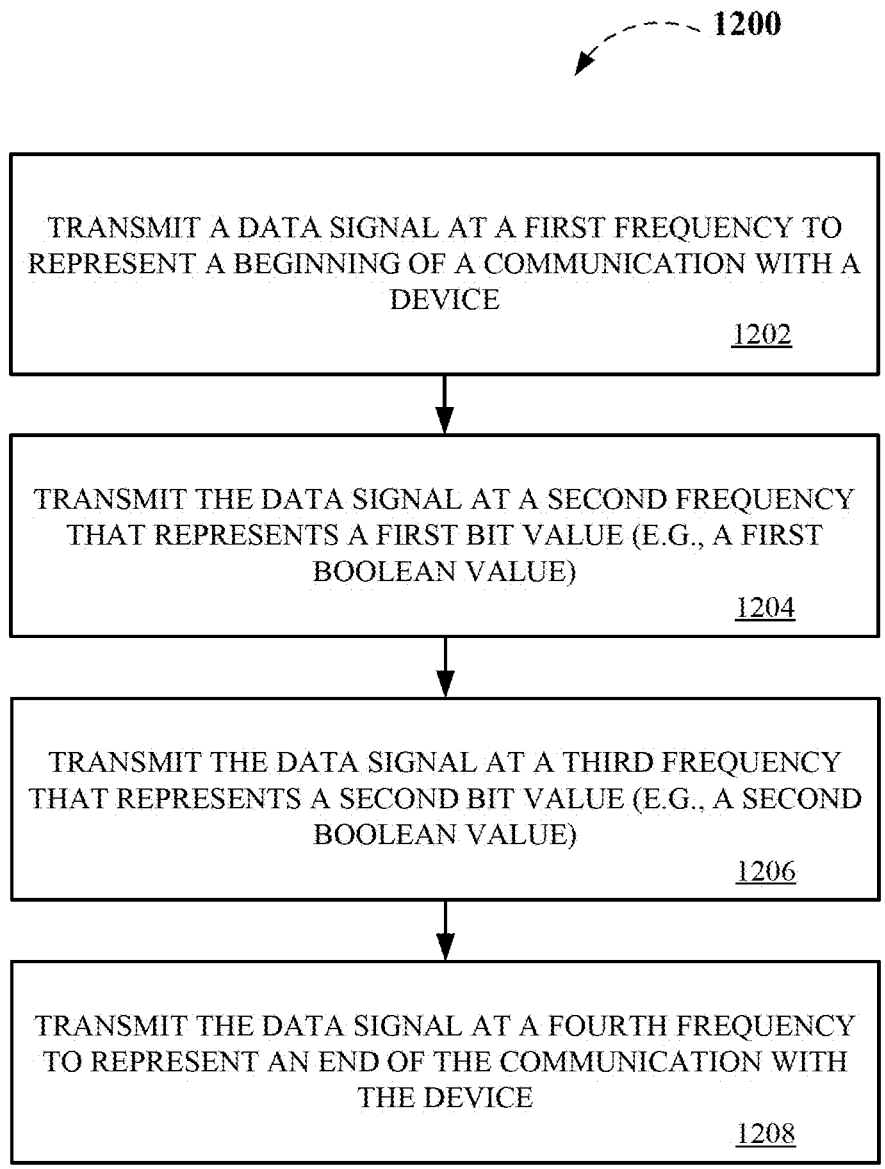
FIG. 12 is a flowchart of another example methodology for communicating data as a function of frequency, in accordance with various aspects and implementations described herein.

FIG. 12 depicts an exemplary flowchart of a non-limiting method 1200 for communicating data as a function of frequency, according to various non-limiting aspects of the subject disclosure. In an aspect, the method 1200 can be associated with a digital signal processor (e.g., the DSP 104). Initially, at 1202, a data signal is transmitted at a first frequency to represent a beginning of a communication with a device. In one example, the device can be a digital microphone. In an aspect, the data signal can be transmitted at the first frequency via a clock communication channel. At 1204, the data signal is transmitted at a second frequency that represents a first bit value (e.g., a first Boolean value). For example, the data signal can transmitted at a second frequency that represents a Boolean value equal to '0'. In an aspect, the data signal can be transmitted at the second frequency via the clock communication channel. At 1206, the data signal is transmitted at a third frequency that represents a second bit value (e.g., a second Boolean value). For example, the data signal can transmitted at a third frequency that represents a Boolean value equal to '1'. In an aspect, the data signal can be transmitted at the third frequency via the clock communication channel. At 1206, the data signal is transmitted at a fourth frequency to represent an end of the communication with the device. In an aspect, the data signal can be transmitted at the fourth frequency via the clock communication channel.

Figure 13:
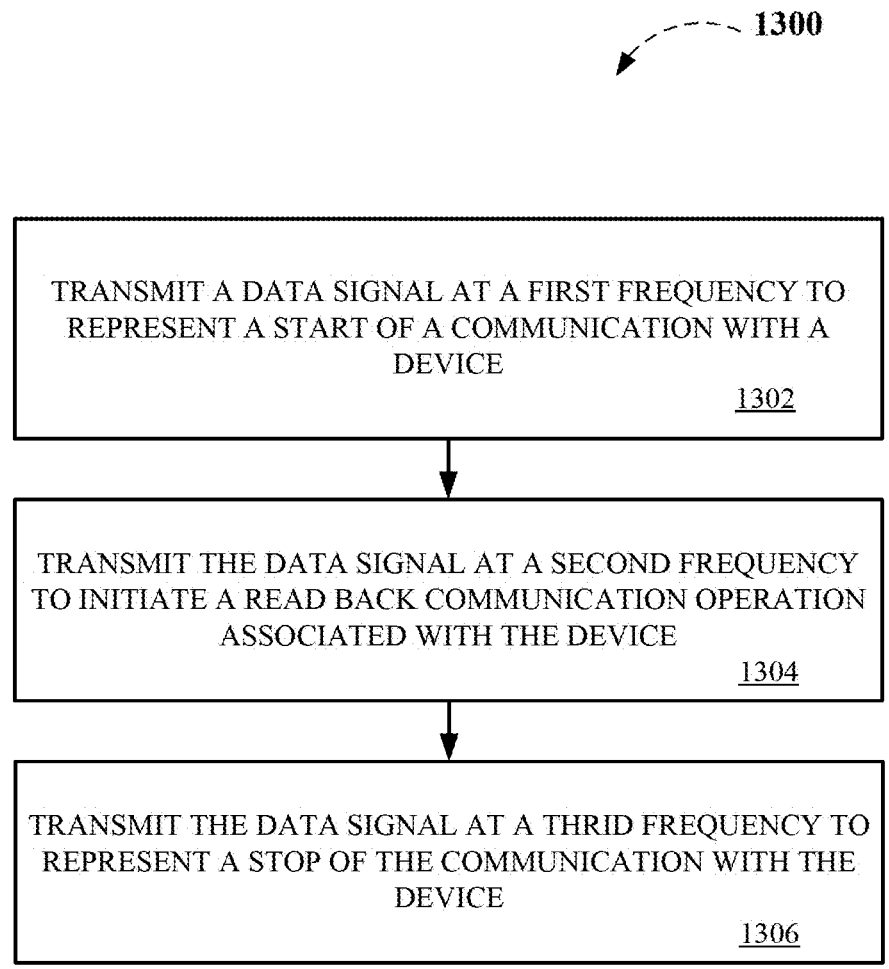
FIG. 13 is a flowchart of yet another example methodology for communicating data as a function of frequency, in accordance with various aspects and implementations described herein.

FIG. 13 depicts an exemplary flowchart of a non-limiting method 1300 for communicating data as a function of frequency, according to various non-limiting aspects of the subject disclosure. It is to be appreciated that the method 1300 can be employed additionally or alternatively with respect to the method 1100 and the method 1200. In an aspect, the method 1300 can be associated with a digital signal processor (e.g., the DSP 104). Initially, at 1302, a data signal is transmitted at a first frequency to represent a start of a communication with a device. In one example, the device can be a digital microphone. At 1304, the data signal is transmitted at a second frequency to initiate a read back communication operation associated with the device. At 1306, the data signal is transmitted at a third frequency to represent a stop of the communication with the device. In an aspect, the data signal can be transmitted at the first frequency, the second frequency and/or the third frequency via a clock communication channel.

Figure 14:
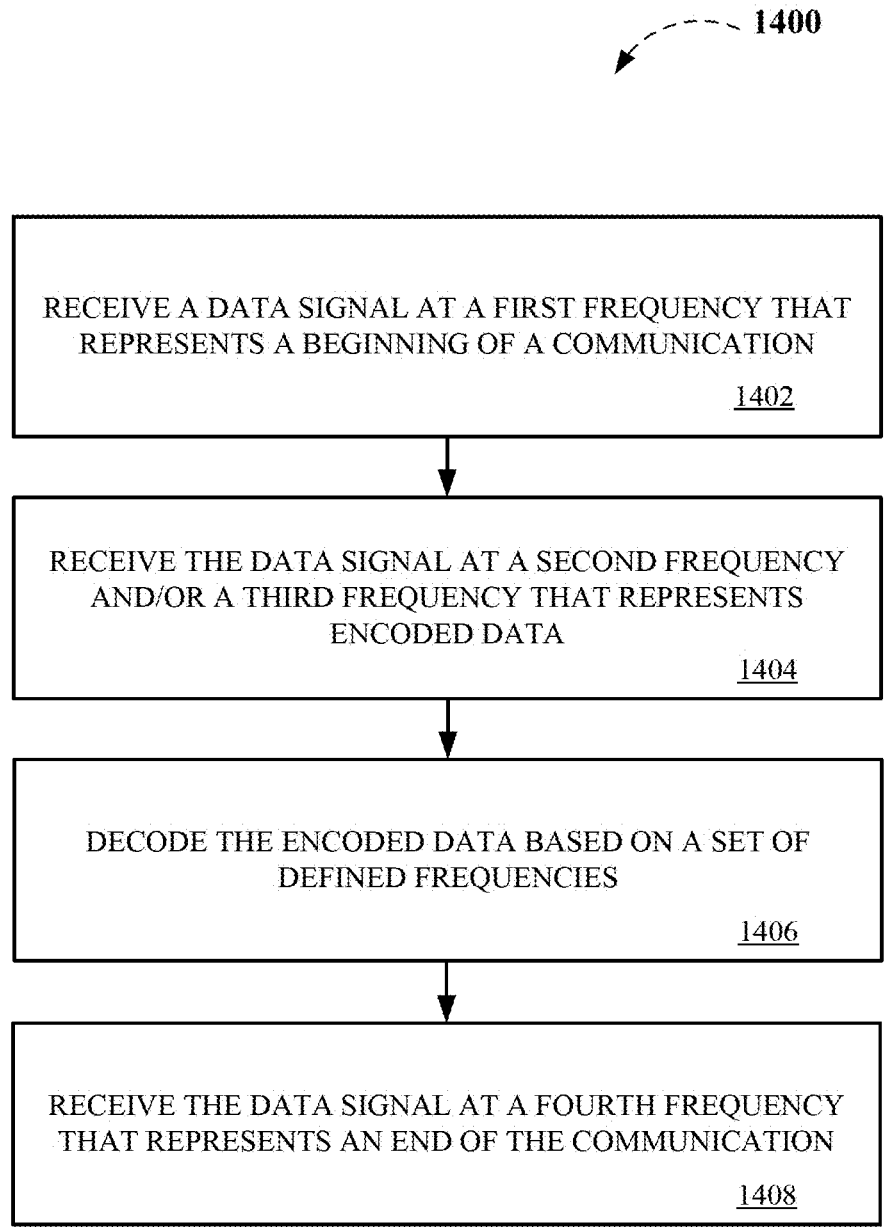
FIG. 14 is a flowchart of yet another example methodology for communicating data as a function of frequency, in accordance with various aspects and implementations described herein.

FIG. 14 depicts an exemplary flowchart of a non-limiting method 1400 for communicating data as a function of frequency, according to various non-limiting aspects of the subject disclosure. In an aspect, the method 1400 can be associated with a frequency detection circuit (e.g., the frequency detection circuit 108). Initially, at 1402, a data signal is received at a first frequency that represents a beginning of a communication. At 1404, the data signal is received at a second frequency and/or a third frequency that represents encoded data. For example, the data signal can include a set of bit values that are encoded as a function of the second frequency and/or the third frequency. In an aspect, the data signal can be received via a clock communication channel. At 1406, the encoded data is decoded based on a set of defined frequencies. For example, the second frequency can be defined as a first bit value (e.g., a Boolean value equal to '0') and the second frequency can be defined as a second bit value (e.g., a Boolean value equal to '1'). At 1408, the data signal is received at a fourth frequency that represents an end of the communication.

It is to be appreciated that various exemplary implementations of exemplary methods 1100, 1200, 1300 and 1400 as described can additionally, or alternatively, include other process steps associated with features or functionality for communicating data as a function of frequency, as further detailed herein, for example, regarding FIGS. 1-10.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described. In some embodiments, a component can comprise software instructions stored on a memory and executed by a processor (e.g., DSP 104, another processor, etc.). Memory can be a computer-readable storage medium storing computer-executable instructions and/or information for performing the functions described herein with reference to the systems and/or methods disclosed.

As used in this application, the terms "component," "system," "interface," and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

In another example, respective components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

Various aspects or features described herein can be implemented as a method, apparatus, system, or article of manufacture using standard programming or engineering techniques. In addition, various aspects or features disclosed in this disclosure can be realized through program modules that implement at least one or more of the methods disclosed herein, the program modules being stored in a memory and executed by at least a processor. Other combinations of hardware and software or hardware and firmware can enable or implement aspects described herein, including a disclosed method(s). The term "article of manufacture" as used herein can encompass a computer program accessible from any computer-readable device, carrier, or storage media. For example, computer readable storage media can include but are not limited to magnetic storage devices (e.g., hard disk, floppy disk, magnetic strips . . . ), optical discs (e.g., compact disc (CD), digital versatile disc (DVD), blu-ray disc (BD) . . . ), smart cards, and flash memory devices (e.g., card, stick, key drive . . . ), or the like.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor may also be implemented as a combination of computing processing units.

In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or methods herein are intended to include, without being limited to including, these and any other suitable types of memory.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:
1. A system, comprising:
a microelectromechanical systems (MEMS) sensor;
a digital signal processor coupled to the MEMS sensor; and
a frequency detection circuit configured to receive data encoded as a function of frequency from the digital signal processor via a clock communication channel,
wherein the digital signal processor is configured to transmit the data at a first frequency to represent a start of a communication with the frequency detection cir- cuit, and to transmit the data at a second frequency to represent an end of the communication with the frequency detection circuit.

2. The system of claim 1, wherein the digital signal processor comprises a clock pin, and wherein the clock pin is utilized for transmission of the data to the frequency detection circuit.

3. The system of claim 1, wherein the digital signal processor is configured to transmit the data at a third frequency to represent a first Boolean value, and to transmit the data at a fourth frequency to represent a second Boolean value.

4. The system of claim 3, wherein the frequency detection circuit is configured to decode the data as the first Boolean value in response to detection of the data at the third frequency.

5. The system of claim 3, wherein the frequency detection circuit is configured to decode the data as the second Boolean value in response to detection of the data at the fourth frequency.

6. The system of claim 3, wherein the digital signal processor is configured to transmit the data at a fifth frequency to initiate an operation associated with the frequency detection circuit.

7. The system of claim 6, wherein the frequency detection circuit is configured to transmit other data associated with the operation to the digital signal processor via a data communication channel.

8. The system of claim 7, wherein the digital signal processor comprises a data pin, and wherein the data pin is utilized to receive the other data from the frequency detection circuit.

9. The system of claim 1, wherein the frequency detection circuit is associated with a digital microphone.

10. The system of claim 1, wherein the digital signal processor is associated with a codec.

11. A method, comprising:
transmitting, by a digital signal processor coupled to a microelectromechanical systems (MEMS) sensor, a data signal at a first frequency to represent a start of a communication with a device configured to receive the data signal via a clock communication channel;
transmitting, by the digital signal processor, data that is encoded as a function of frequency via the data signal; and
transmitting, by the digital signal processor, the data signal at a second frequency to represent a stop of the communication with the device.

12. The method of claim 11, wherein the transmitting the data comprises transmitting the data signal at a third frequency to represent a first data value.

13. The method of claim 12, wherein the transmitting the data comprises transmitting the data signal at a fourth frequency to represent a second data value.

14. The method of claim 11, wherein the transmitting the data comprises transmitting the data via the clock communication channel.

15. The method of claim 11, further comprising:
transmitting, by the digital signal processor, the data signal at a third frequency to initiate a read back communication operation associated with the device.

16. A device, comprising:
a processor that is coupled to a microelectromechanical systems (MEMS) sensor and is configured to transmit a data signal at a first frequency to represent a beginning of a communication with another device configured to receive the data signal via a clock communication channel, transmit data via the data signal that is encoded as a function of frequency, and transmit the data signal at a second frequency to represent an end of the communication with the other device.

17. The device of claim 16, wherein the processor comprises a frequency encoder component configured to encode the data as a function of the frequency.

18. The device of claim 16, wherein the processor is configured to transmit the data signal via the clock communication channel.

19. The device of claim 16, wherein the processor is configured to transmit the data at a third frequency to represent a first Boolean value, and to transmit the data at a fourth frequency to represent a second Boolean value.

20. A device, comprising:
a digital signal processor coupled to a microelectromechanical systems (MEMS) sensor; and
a frequency detection circuit configured to receive, from the digital signal processor via a clock communication channel, a data signal at a first frequency that represents a beginning of a communication, receive the data signal at a second frequency that represents encoded data, receive the data signal at a third frequency representing an end of the communication, and decode the encoded data based on a set of defined frequencies.

21. The device of claim 20, wherein the digital signal processor comprises a clock pin, and wherein the clock pin is utilized for transmission of the data signal to the frequency detection circuit.

22. The device of claim 20, wherein the digital signal processor comprises a data pin, and wherein the data pin is utilized to receive another data signal from the frequency detection circuit.

* * * * *